United States Patent
Lee et al.

(10) Patent No.: US 8,070,919 B2
(45) Date of Patent: Dec. 6, 2011

(54) METHOD FOR PREPARING ONE DIMENSIONAL SPIN PHOTONIC CRYSTAL DEVICE AND ONE DIMENSIONAL SPIN PHOTONIC CRYSTAL DEVICE PREPARED BY THE SAME

(75) Inventors: Young-Pak Lee, Seoul (KR); Joo-Yull Rhee, Gyeonggi-do (KR); Jin-Bae Kim, Seoul (KR); Geon-Joon Lee, Seoul (KR)

(73) Assignee: IUCF-HYU (Industry-University Cooperation Foundation Hanyang University), Seoul (KR)

( * ) Notice: Subject to any disclaimer, the term of this patent is extended or adjusted under 35 U.S.C. 154(b) by 661 days.

(21) Appl. No.: 12/113,400

(22) Filed: May 1, 2008

(65) Prior Publication Data
US 2009/0022996 A1    Jan. 22, 2009

(30) Foreign Application Priority Data

Jul. 16, 2007  (KR) .................. 10-2007-0070986
Apr. 10, 2008  (KR) .................. 10-2008-0032951

(51) Int. Cl.
C23C 14/00 (2006.01)
C23C 14/32 (2006.01)
G03F 1/00 (2006.01)
G03F 7/00 (2006.01)
G02F 1/09 (2006.01)

(52) U.S. Cl. ......... 204/192.26; 204/192.14; 204/192.15; 430/321; 359/280

(58) Field of Classification Search ............. 204/192.14, 204/192.15, 192.26; 359/280; 430/321
See application file for complete search history.

(56) References Cited

U.S. PATENT DOCUMENTS

| 6,545,795 B2 * | 4/2003 | Matsushita et al. | 359/280 |
| 7,504,008 B2 * | 3/2009 | Doan et al. | 204/192.38 |
| 2004/0100892 A1 * | 5/2004 | Horimai | 369/103 |
| 2005/0255581 A1 * | 11/2005 | Kim et al. | 435/287.2 |
| 2008/0032237 A1 * | 2/2008 | Wong et al. | 430/321 |
| 2009/0060411 A1 * | 3/2009 | Levy et al. | 385/6 |

FOREIGN PATENT DOCUMENTS

JP   2000329920 A * 11/2000
WO   WO 2006015989 A1 * 2/2006

OTHER PUBLICATIONS

JP 2000329920 (Japanese Abstract).*
JP 2000329920 (Derwent Abstract).*

* cited by examiner

Primary Examiner — Alexa Neckel
Assistant Examiner — Michael Band
(74) Attorney, Agent, or Firm — Alston & Bird LLP

(57) ABSTRACT

Provided is a method for preparing a one-dimensional spin photonic crystal device and a one-dimensional spin photonic crystal device prepared by the same. The method comprises forming magnetic and nonmagnetic regions by the interference of laser beams generated from a femtosecond laser light source. The method of the present invention enables production of one-dimensional spin photonic crystals having excellent properties by a rapid and simple process, and is therefore suitable for high integration and large-scale production of desired devices. Further, the prepared photonic crystals exhibit excellent magneto-optical effects and are therefore applicable to development of novel optical devices, and the like.

5 Claims, 3 Drawing Sheets

M1, M2, M3, M4, M5, M6, M5, M6, M7, M8: Mirror

METHOD FOR PREPARING ONE DIMENSIONAL SPIN PHOTONIC CRYSTAL DEVICE AND ONE DIMENSIONAL SPIN PHOTONIC CRYSTAL DEVICE PREPARED BY THE SAME

BACKGROUND OF THE INVENTION

1. Field of the Invention

The present invention relates to a method for preparing a one-dimensional spin photonic crystal device and a one-dimensional spin photonic crystal device prepared by the same. More specifically, the present invention relates to a method for preparing a one-dimensional spin photonic crystal device, which enables fabrication of a one-dimensional spin photonic crystal device having excellent properties by an inexpensive and efficient method, and a one-dimensional spin photonic crystal device prepared by the same.

2. Description of the Related Art

A great deal of attention has recently been focused on photonic crystals as a promising material necessary for the development of the next-generation optical communication devices such as nanolasers, superprisms capable of processing multiwavelength optical information, waveguides, and the like, and photon computers having ultra-high-speed information processing capacity (e.g. several tens of Terabit/sec transmissions).

Photonic crystals are composed of periodic structures of materials having different refractive indices. Prominent examples of the photonic crystals are found in the naturally occurring gemstone opal, the morpho butterfly's wings, peacock feathers and the like. An important property of the photonic crystals is in that the color of reflecting light appears to vary according to the incident direction of light. Based on this principle, techniques for preparation of photonic crystals have been actively researched which are capable of controlling a direction of travel of light by modifying a crystal structure of a light-reactive material. Out of those attempts, a great deal of interest has been given to spin photonic crystals (SPCs, or magnetic photonic crystals (MPCs)), particularly for interactions between charges and spins of electrons and photons.

Optical properties of SPCs may vary with external application of a magnetic field. In addition, temperature is another important variable that may affect the optical properties of SPCs, since the magnetic transition at their Curie or Nèel temperature may lead to changes in the magnetic permeability. As a consequence, the dielectric constant of SPCs is altered.

Conventionally, spin photonic crystal devices have been fabricated by selective-area reactive ion etching or electron-beam lithography followed by ion milling. However, the conventional fabrication methods, such as selective-area reactive ion etching or electron-beam lithography followed by ion milling, usually involve chemical reactions. Therefore, precise control of reaction conditions is essential including pressure, temperature, and the like. In addition, such conventional methods suffer from various disadvantages such as complexity of processes, long production time, high production costs and therefore consequent lack of economic rationality.

SUMMARY OF THE INVENTION

Therefore, the present invention has been made in view of the above problems, and it is an object of the present invention to provide a method for preparing a one-dimensional spin photonic crystal device, which is suitable for high integration and industrial-scale production of devices and is economically effective and inexpensive.

It is another object of the present invention to provide a one-dimensional spin photonic crystal device having improved properties, particularly magneto-optical effects.

In accordance with an aspect of the present invention, the above and other objects can be accomplished by the provision of a method for preparing a one-dimensional spin photonic crystal device, comprising forming magnetic and nonmagnetic regions by the interference of laser beams generated from a femtosecond laser light source. The femtosecond laser beam interference can be made by splitting a laser beam, which was generated from the femtosecond laser light source, into first and second laser beams, followed by incidence of the first and second split laser beams via different paths.

In one embodiment of the present invention, the pulse energies of the first and second incident laser beams are equal to each other, and the fringe spacing between the magnetic and nonmagnetic regions may be adjusted by controlling the intersection angle between the first and second laser beams and wavelengths of the first and second laser beams. In the context of the present invention, the fringe spacing between the magnetic and nonmagnetic regions may be tuned according to the following equation 1:

$$a=\lambda/(2\times\sin(\theta/2)) \qquad \text{(Equation 1)}$$

In Equation 1, a represents a fringe spacing between the magnetic and nonmagnetic regions, $\lambda$ represents a laser beam wavelength, and $\theta$ represents the intersection angle between the first and second laser beams.

In another embodiment of the present invention, the device comprises a substrate; and a thin film deposited on the substrate. The thin film may include $Co_2MnSi$, and the substrate may include glass.

In another embodiment of the present invention, the femtosecond laser may be a titanium-sapphire laser, and the thin film may be deposited on the substrate by magnetron sputtering.

In accordance with another aspect of the present invention, there is provided a one-dimensional spin photonic crystal having improved magneto-optical effects, comprising a substrate and a thin film deposited on the substrate, wherein the thin film includes magnetic and nonmagnetic regions formed by the interference of laser beams generated from a femtosecond laser light source. The thin film may include $Co_2MnSi$, and the substrate may include glass.

DETAILED DESCRIPTION OF THE PREFERRED EMBODIMENTS

Figure 1:
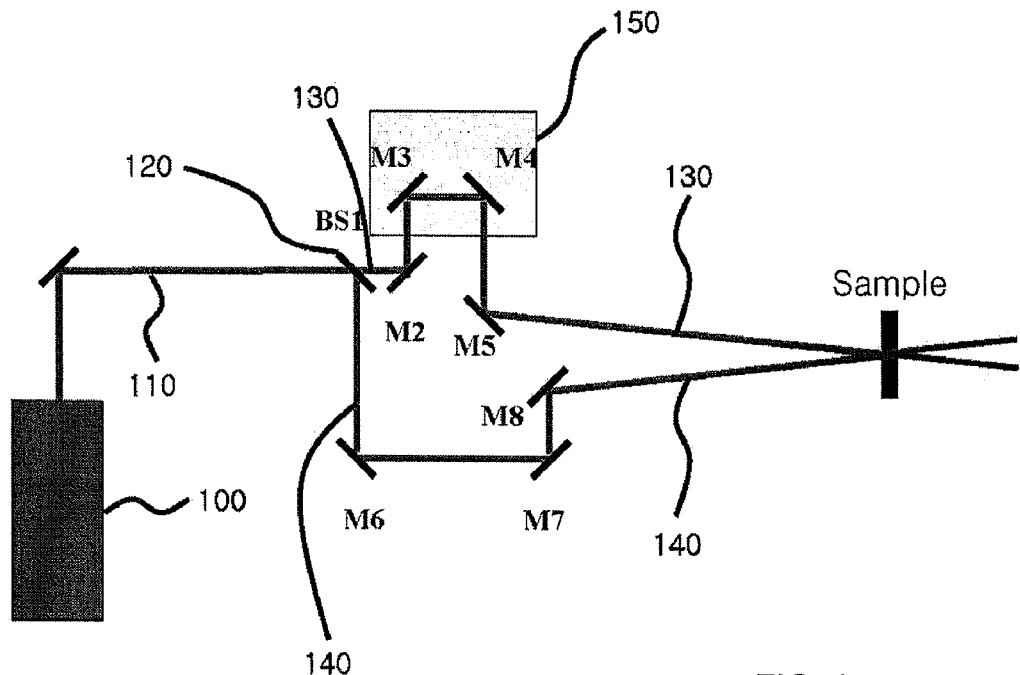
FIG. 1 shows a diagram illustrating preparation of one-dimensional spin photonic crystals in accordance with one embodiment of the present invention.

As discussed hereinbefore, the present invention provides a method for preparing a one-dimensional spin photonic crystal device, comprising forming magnetic and nonmagnetic regions on a substrate surface by the interference of pulsed laser beams generated from a femtosecond laser light source. The femtosecond laser is pulsed laser which has pulse duration of approx. several femtoseconds and is capable of producing an instantaneous power output corresponding to terawatts ($10^{12}$ W) when it is amplified. The present invention was conceived on the fact that it is possible to prepare photonic crystals having very excellent magnetic and nonmagnetic regions when a photonic crystal device is fabricated by inducing the interference of femtosecond laser pulses. Particularly, the one-dimensional spin photonic crystals prepared according to the method of the present invention exhibit significant improvements in magneto-optical properties such as Kerr rotation.

In one embodiment of the present invention, two-beam interference of femtosecond laser pulses may be created by splitting a laser beam, which was generated from the femtosecond laser light source, into first and second laser beams, followed by incidence of the first and second split laser beams on the same position on a surface of the device via different paths. As a consequence, the beam interference where reinforcement and extinction of the laser beam intensity are periodically repeated can be created on the surface of the device. As a result, selective-area annealing at high temperatures can be achieved by incidence of a high-energy laser beam (reinforcement) on one region of the device surface and incidence of a relatively low-energy laser beam (extinction) on the other region of the device surface. However, the present invention is not limited to the above-mentioned configuration. Any configuration falls within the scope of the present invention, as long as the beam interference can be produced on the device surface.

Further, when the pulse energies of the first and second split laser beams are different to each other, the fringe visibility of the interference pattern is decreased, and irregular magnetic and nonmagnetic regions are formed on the surface of the thin film. For these reasons, in one embodiment of the present invention, the pulse energies of two split laser beams are preferably equal to each other.

Further, in the context of the present invention, the fringe spacing between the magnetic and nonmagnetic regions formed on the surface of the device may be easily tuned according to Equation 1, by altering incident angles of the first and second laser beams or wavelengths of laser beams.

In another embodiment of the present invention, the device comprises a substrate and a thin film deposited on the substrate. The thin film may include $Co_2MnSi$, and the substrate may include glass. According to the present invention, a $Co_2MnSi$ thin film was deposited onto a substrate. The transmission-electron microscopy (TEM) study revealed that the as-deposited film had an almost amorphous structure and exhibited no magnetic responses. Specifically, it is believed to be due to that some of the Heusler alloys lose their magnetism upon structural order-disorder transition. However, when interference pulses of femtosecond laser are generated according to the present invention on the amorphous $Co_2MnSi$ thin film, the occurrence of the interference pulses results in crystallization of the amorphous $Co_2MnSi$ thin film. Then, the femtosecond laser-interference crystallization gives magnetism to the film. Further, according to the present invention, the crystal device having a selective magnetic region formed by interference pulses of femtosecond laser has a considerably enhanced Kerr rotation, which will be specifically described in the following Experimental Examples.

In another embodiment of the present invention, the femtosecond laser may be a titanium-sapphire laser, even though there is no particular limit to the femtosecond laser. Therefore, any kinds of laser light sources fall within the scope of the present invention, as long as they can generate the femtosecond laser beam.

In another embodiment of the present invention, the thin film may be deposited by magnetron sputtering. Sputtering is a technique which involves introduction of a sputtering gas into a sputtering chamber under a vacuum atmosphere, collision of the gas with a sputtering target to generate plasma, and deposition of the resulting plasma on a substrate. Particularly in the context of the present invention, the term "magnetron sputtering" as used in connection with deposition of the amorphous $Co_2MnSi$ thin film refers to a method in which the generated plasma was collected by the permanent magnet-generated flux and then deposited on a substrate. The magnetron sputtering advantageously produces homogeneous plasma by the action of magnetic flux, thus resulting in formation of a uniform thin film. In another embodiment of the present invention, the amorphous $Co_2MnSi$ thin film was deposited on the substrate at room temperature under a vacuum condition of less than $3\times10^{-7}$ Torr. The sputtering target was prepared from a $Co_2MnSi$ ingot produced by arc melting a stoichiometric mixture of Co, Mn, and Si powders. The Ar pressure was kept at 0.5 mTorr to 1.5 mTorr, preferably 1 mTorr, during deposition of the amorphous $Co_2MnSi$ thin film, and the deposition rate was 6 nm to 8 nm/min, preferably 7 nm/min.

Further, the present invention provides one-dimensional spin photonic crystals having improved magneto-optical effects, comprising a substrate and a thin film deposited on the substrate, wherein the thin film includes magnetic and nonmagnetic regions formed by the interference of pulsed laser beams generated from a femtosecond laser light source. As described before, one-dimensional spin photonic crystals in accordance with the present invention have magnetic and nonmagnetic regions formed by using the selective-area annealing with the interference technique of pulsed laser beams, and produces pronounced magneto-optical effects (e.g. enhanced Kerr rotation).

In one embodiment of the present invention, the thin film may include $Co_2MnSi$, and the substrate may include glass.

EXAMPLES

Now, the present invention will be described in more detail with reference to the following Examples. These examples are provided only for illustrating the present invention and should not be construed as limiting the scope and spirit of the present invention.

Example 1

Example 1-1

Thin Film Deposition

An amorphous $Co_2MnSi$ thin film was deposited on a glass substrate using magnetron sputtering.

More specifically, a sputtering target was prepared from a $Co_2MnSi$ ingot produced by arc melting a stoichiometric mixture of Co, Mn, and Si powders. The sputtering target had a composition of Co(99.5%, SIGMA-ALDRICH):Mn (99.98% SIGMA-ALDRICH):Si(99.95%, SIGMA-ALDRICH) in a ratio of 2:1:1, and a temperature elevation rate was 50□/min. After preparation of the $Co_2MnSi$ ingot was complete, the ingot was ground into powder by wet ball milling and then compressed to prepare a sputtering target having a size of 2 inches.

Thereafter, an amorphous $Co_2MnSi$ thin film was deposited on a glass substrate using radio-frequency magnetron sputtering (RF magnetron sputtering) at room temperature under a base pressure of less than $3\times10^{-7}$ Torr. The argon pressure was kept at 1 mTorr during deposition, and the deposition rate was 7 nm/min.

Example 1-2

Preparation of One-Dimensional Spin Photonic Crystals

Interference of femtosecond laser beams was applied to the amorphous $Co_2MnSi$ thin film of Example 1-1 to thereby prepare one-dimensional spin photonic crystals having a repeated structure of magnetic and nonmagnetic regions. The process will be described in more detail with reference to the accompanying drawings.

FIG. 1 shows a diagram illustrating the preparation of one-dimensional spin photonic crystals in accordance with one embodiment of the present invention.

Referring to FIG. 1, a femtosecond laser beam 110 generated from a titanium-sapphire laser light source 100 was split into two femtosecond laser beams 130,140 through a beam splitter 120. The first femtosecond laser beam 130 and the second femtosecond laser beam 140 were each incident on a surface of the $Co_2MnSi$ thin film via different paths. The femtosecond laser beam 110 had 800 nm output wavelength, 130 fs pulse duration, 1.0 mJ maximum pulse energy, 1 kHz repetition rate, and 3000 laser shots. In one embodiment of the present invention, a motorized translation stage (TS) 150, which is capable of controlling a path length of the first femtosecond laser beam 130, was further provided to induce two-beam interference of femtosecond laser pulses.

The intersection angle between the first femtosecond laser beam 130 and the second femtosecond laser beam 140, each of which was incident on a surface of the amorphous $Co_2MnSi$ thin film as a sample, was 24 degrees. The first and second femtosecond laser beams incident at the intersection angle of 24 degrees formed an interference pattern of repeated reinforcement and extinction on the surface of the amorphous $Co_2MnSi$ thin film, which thereby resulted in preparation of one-dimensional spin photonic crystals having alternating arrays of magnetic and nonmagnetic regions.

Experimental Example 1

Surface Analysis

Figure 2A:
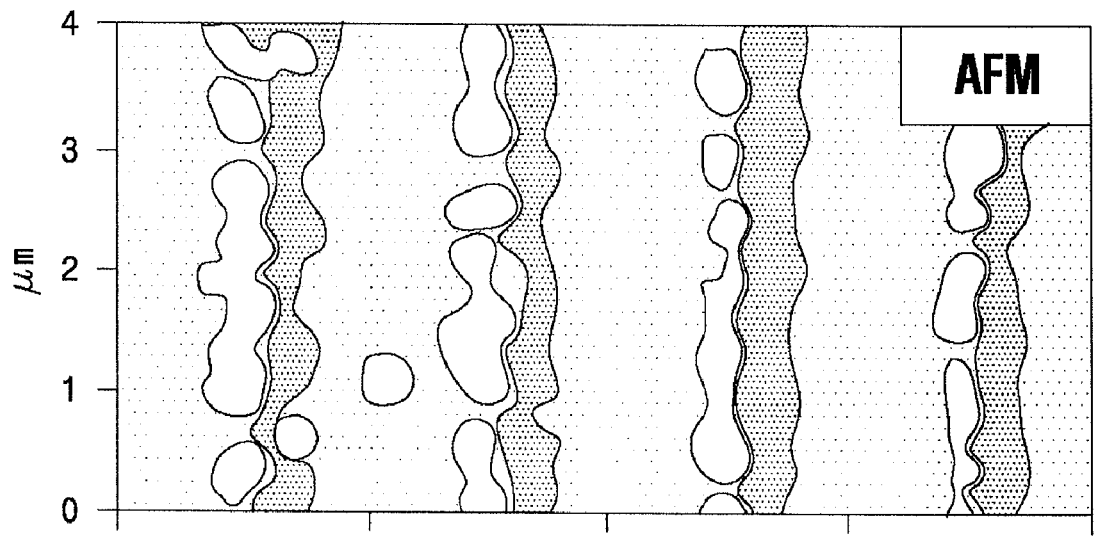
FIGS. 2a and 2b show Atomic Force Microscopy (AFM) and Magnetic Force Microscopy (MFM) images for one-dimensional spin photonic crystals prepared in Example 1.
Figure 2B:
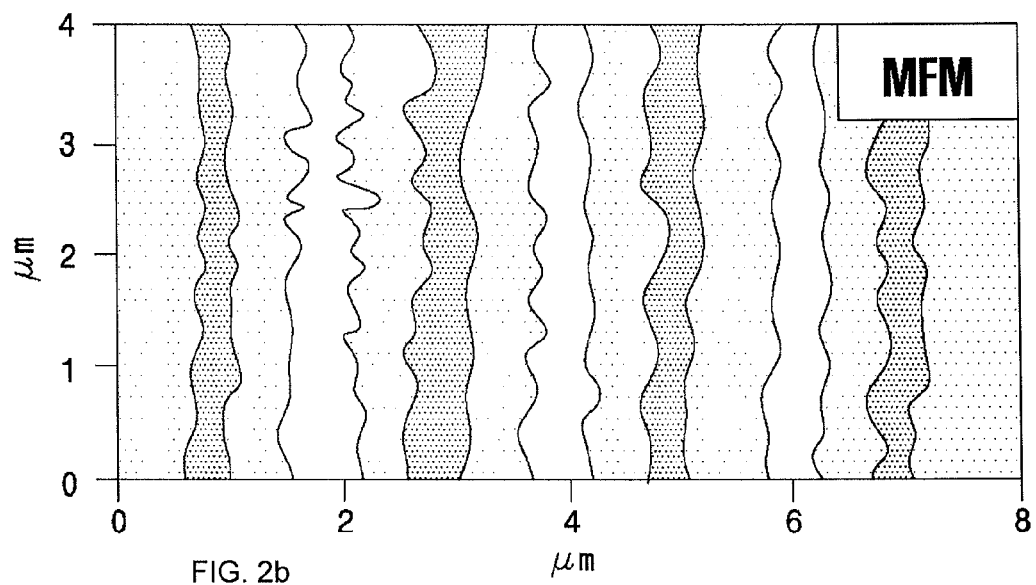

FIGS. 2a and 2b show Atomic Force Microscopy (AFM) and Magnetic Force Microscopy (MFM) images for one-dimensional spin photonic crystals prepared in Example 1.

Referring to FIGS. 2a and 2b, it can be seen that photonic crystals of Example 1-2 fabricated by using the selective-area annealing with the two-beam interference technique of femtosecond laser pulses have one-dimensional spin grating formed thereon. Particularly, the AFM image of FIG. 2a shows that the bright-band region with a relatively rough surface and the dark-band region with a relatively smooth surface were formed with the uniform fringe spacing on surfaces of the photonic crystals. Further, the corresponding MFM image in FIG. 2b shows that two regions having different properties (magnetic and nonmagnetic regions) were repeatedly and periodically formed on surfaces of the photonic crystals of Example 1. Further, the above microscopic images all exhibit clear formation of the boundary between the magnetic and nonmagnetic regions formed on surfaces of the one-dimensional spin photonic crystals fabricated according to the present invention. From these results, the photonic crystals fabricated according to the present invention have a periodically repeating structure comprising magneto-optical properties of metallic magnetic materials having off-diagonal components of the dielectric constant tensor, and optical properties of metallic nonmagnetic materials having diagonal components of the dielectric constant tensor only. As a consequence, such a structural feature suggests that the one-dimensional spin photonic crystals fabricated according to the present invention repeatedly exhibit two different spin states.

Figure 3:
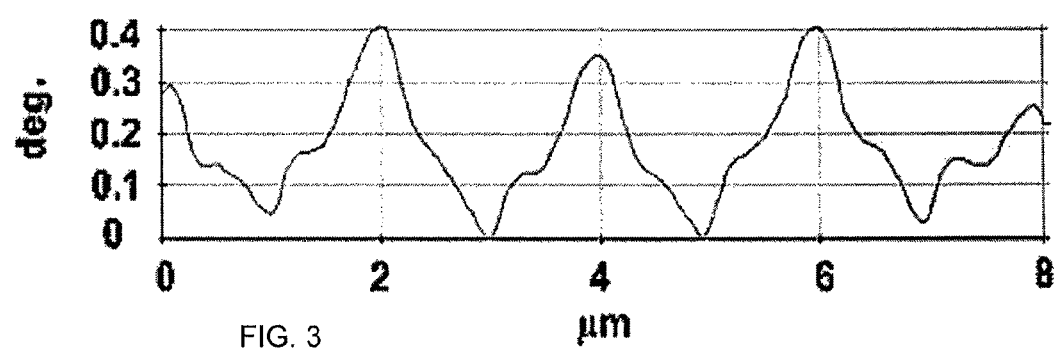
FIG. 3 shows a graph illustrating line profiles of Magnetic Force Microscopy (MFM) for one-dimensional spin photonic crystals prepared in Example 1.

FIG. 3 is a graph showing the MFM line-profile image for one-dimensional spin photonic crystals.

Referring to FIG. 3, it can be seen that the one-dimensional spin photonic crystal device fabricated according to the present invention exhibits two different spin states with the same periodicity of 2 µm, which is consistent with the results as shown in FIGS. 2a and 2b.

Experimental Example 2

Measurement of Magneto-Optical Effects

Magnetic properties of the periodically repeating structure consisting of magnetic and nonmagnetic regions were investigated using a magneto-optical (MO) technique. In this Experimental Example 2, the longitudinal Kerr rotation was measured with an accuracy down to $0.001°$ at a $45°$ incidence through a photoelastic modulator (PEM) of 50 kHz frequency and crystal polarizers with an extinction ratio of more than $10^5$. A He—Ne laser light of 632.8 nm wavelength was used as an incident light source and a photomultiplier (Hamamatsu, R374) was employed as a detection system. For the polarizing optics, two $MgF_2$ Rochon polarizers (Karl Lambrecht Corporation, MFRV5) were used. The external magnetic field was applied perpendicular to the undiffracted (zeroth-order) and first-order diffracted beams using an electromagnet capable of applying a maximum field of ±5 kOe.

Figure 4:
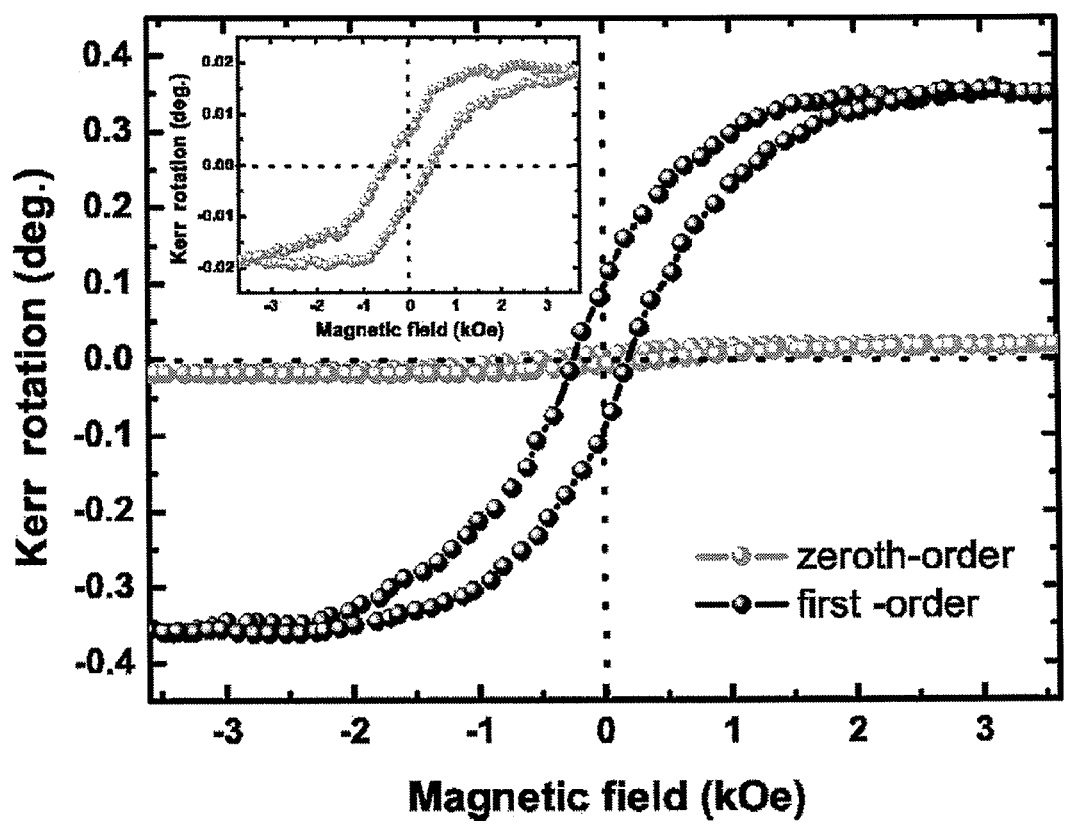
FIG. 4 shows a graph illustrating the results of the longitudinal Kerr rotation obtained for Experimental Example 2.

FIG. 4 is a graph illustrating the results of the longitudinal Kerr rotation obtained for Experimental Example 2.

The graph of FIG. 4 shows magnetic hysteresis loop of the longitudinal Kerr rotation of the first-order diffracted beam compared to the zeroth-order (undiffracted) beam. The measured hysteresis loop suggests that the sample is composed of a few magnetically inhomogeneous phases, which is indicated by a rather steep slope. This result indicates that the one-dimensional spin grating of the present invention, which was fabricated by using the two-beam interference of femtosecond laser, has a periodic structure consisting of magneto-optical properties of magnetic materials having off-diagonal components of the dielectric constant tensor, and optical properties of nonmagnetic materials having diagonal components of the dielectric constant tensor only.

Further, the graph of FIG. 4 shows that the magneto-optical Kerr rotation of the first-order diffracted beam is nearly 18 times larger than that of the zeroth-order beam. Accordingly, a method for preparing the photonic crystal device of the present invention is not only capable of performing optical control simply by adjusting the periodicity of a periodic structure, but also is capable of performing more diverse optical control processes due to another addition of the degree of freedom. In other words, optical control may be carried out by controlling magnetization of a magnetic body via application of external magnetic fields or alteration of temperatures. Alternatively, the optical control can be more widely achieved by controlling magneto-optical properties intrinsic to the magnetic body. Therefore, the above-mentioned results showing improved magneto-optical performance via the combination of photonic crystals with spins can overcome the problem of weak magneto-optical effects which are not sufficient for practical application to devices, and therefore provide a base for development of new advanced optical devices.

As apparent from the above description, a method for preparing a one-dimensional spin photonic crystal device in accordance with the present invention enables production of photonic crystals having a large surface area by a more simplified process, as compared to the conventional art involving chemical fabrication. Therefore, it is suitable particularly for high integration and large-scale production of devices. Further, the one-dimensional spin photonic crystals prepared in accordance with the method of the present invention exhibit excellent magneto-optical effects, and therefore can provide various advantages particularly when they are applied to development of novel optical devices, and the like.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for preparing a one-dimensional spin photonic crystal device having magnetic and nonmagnetic regions, comprising forming magnetic and nonmagnetic regions by the interference of laser beams generated from a femtosecond laser light source, wherein the interference of laser beam is made by splitting a laser beam generated from the femtosecond laser light source into first and second laser beams, followed by incidence of the first and second split laser beams via different paths, wherein a fringe spacing between the magnetic and nonmagnetic regions is adjusted by controlling an intersection angle between the first and second laser beams and wavelengths of the first and second laser beams, wherein the fringe spacing between the magnetic and nonmagnetic regions is tuned according to the following equation 1:

$$a=\lambda/(2\times\sin(\theta/2))$$ (Equation 1)

wherein a represents a fringe spacing between the magnetic and nonmagnetic regions, $\lambda$ represents a laser beam wavelength, and $\theta$ represents the intersection angle between the first and second laser beams wherein the spin photonic crystal device comprises a substrate and a thin film deposited on the substrate, and wherein the thin film is deposited by magnetron sputtering, and wherein the thin film includes a composition of $Co_2MnSi$.

2. The method according to claim 1, wherein the first and second laser beams have the same energy.

3. The method according to claim 1, wherein the femtosecond laser is a titanium-sapphire laser.

4. The method according to claim 1, wherein the substrate includes glass.

5. The method according to claim 1, wherein the intersection angle between the first and second laser beams is approximately 24 degrees.

* * * * *